United States Patent
Ho

[11] Patent Number: 5,858,857
[45] Date of Patent: Jan. 12, 1999

[54] METHOD OF FORMING TOP CORNER ROUNDING OF SHALLOW TRENCHES IN SEMICONDUCTOR SUBSTRATE

[75] Inventor: Michael Ho, Hsinchu, Taiwan

[73] Assignee: Winbond Electronics Corp., Hsinchu, Taiwan

[21] Appl. No.: 843,719

[22] Filed: Apr. 17, 1997

[30] Foreign Application Priority Data

Feb. 14, 1997 [TW] Taiwan .................................. 86101760

[51] Int. Cl.$^6$ ..................................................... H01L 21/76
[52] U.S. Cl. ........................... 438/424; 438/426; 438/978
[58] Field of Search ..................................... 438/425, 443, 438/229, 230, 232, 426, 424, 227

[56] References Cited

U.S. PATENT DOCUMENTS

| 4,391,409 | 7/1983 | Nakajima et al. . |
| 4,407,851 | 10/1983 | Kurosawa et al. . |
| 4,471,525 | 9/1984 | Sasaki . |
| 4,622,096 | 11/1986 | Dil et al. . |
| 4,693,781 | 9/1987 | Leung et al. . |
| 4,892,614 | 1/1990 | Chapman et al. . |
| 4,916,086 | 4/1990 | Takahashi et al. . |
| 4,923,821 | 5/1990 | Namose . |
| 5,130,268 | 7/1992 | Liou et al. . |
| 5,350,491 | 9/1994 | Fulford, Jr. et al. . |
| 5,578,518 | 11/1996 | Koike et al. . |
| 5,728,621 | 3/1998 | Zheng et al. . |

FOREIGN PATENT DOCUMENTS

| 58-135655 | 8/1983 | Japan . |
| 59-75667 | 4/1984 | Japan . |
| 63-241949 | 10/1988 | Japan . |
| 2-277253 | 11/1990 | Japan . |

OTHER PUBLICATIONS

Wolf, S., "Silicon Processing for the VLSI Era:vol. 2, Process Integration", Lattice Press, pp. 54–55, 1990.

Primary Examiner—George R. Fourson
Attorney, Agent, or Firm—Finnegan, Henderson, Farabow, Garrett & Dunner, L.L.P.

[57] ABSTRACT

A method of forming shallow trenches in a semiconductor substrate is provided. This method allows the thus-formed trenches to be shaped with a rounded top corner having a desired radius of curvature in accordance with actual requirements. From experiments, it is learned that the radius of curvature of the top corners of the trenches decreases linearly with the depth of a pre-trench formed by over-etching in the substrate. The relationship between radius of curvature and depth of pre-trench can be pre-established by experimentation. After that, the top corners of the shallow trenches in the substrate can be controlled to be shaped with a desired radius of curvature by adjusting the depth of the pre-trench based on the pre-established linear relationship. In this method, the substrate is removed to a predetermined depth corresponding to the desired radius of curvature of the top corner of the to-be-formed trench; then, thermal oxidation is performed on the substrate so as to form an oxide layer on the exposed area of the substrate; and finally, the oxide layer is removed. The empty space left by the removed oxide layer serves as the desired trench.

7 Claims, 5 Drawing Sheets

METHOD OF FORMING TOP CORNER ROUNDING OF SHALLOW TRENCHES IN SEMICONDUCTOR SUBSTRATE

BACKGROUND OF THE INVENTION

1. Field of the Invention

This invention relates to semiconductor fabrication processes, and more particularly, to a method for forming shallow trenches in a semiconductor substrate with rounded top corners that can be shaped with a desired radius of curvature.

2. Description of Related Art

In semiconductor technology, the so-called isolation process is used to suitably isolate the transistor elements in an integrated circuit (IC) chip from each other so as to prevent interference or a short-circuit therebetween. Conventional isolation processes are usually based on the so-called local oxidation of silicon (LOCOS) method. In more advanced VLSI (very large-scale integration) technology, hundreds of thousands transistor elements can be integrated on a single IC chip with an area of less than 2 cm$^2$. To provide isolation for such a great density of transistor elements in the IC chip, the so-called shallow trench isolation method is used in place of the LOCOS method. In a shallow trench isolation process, the anisotropic dry etching process is performed on the substrate so as to dig trenches between neighboring transistor elements in the substrate. After that, an insulating material, such as silicon dioxide, is filled into the trenches to isolate the neighboring transistor elements.

If the top corners of the thus-formed trenches are too steep, this will cause a concentrated stress that increases the electric field on the gate, thus causing the occurrence of leakage current in the IC chip. This adverse consequence is the so-called corners effect. To provide a rounded top corner for the trenches, a conventional solution is to form a beak-like oxide layer on the substrate and then remove the beak-like oxide layer by etching. This conventional method will be described in detail in the following with reference to FIGS. 1A–1B.

Referring first to FIG. 1A, a semiconductor substrate 100 is prepared. Over the substrate 100, a pad oxide layer 102, such as a layer of silicon dioxide, is formed. Further, a mask layer 104, such as a layer of silicon nitride, is formed over the pad oxide layer 102. A photolithographic and etching process is then performed on the substrate so as to remove selected portions of the mask layer 104 and pad oxide layer 102 to form an opening 101 which exposes a selected surface area of the substrate 100.

Referring next to FIG. 1B, in the subsequent step, a thermal oxidation process is performed on the substrate so as to form a beak-like oxide layer (not shown) on the exposed surface area of the substrate 100. After this, the beak-like oxide layer (not shown) is removed by etching. The empty space which was previously occupied by the removed oxide layer serves as a shallow trench 103 with round top corners 103a.

One major drawback to the foregoing method, however, is that the round top corners 103a of the shallow trench 103 is shaped with a substantial radius of curvature of about 0.0587 μm (micrometer), which can not be arbitrarily shaped in a predetermined manner into a desired radius of curvature in accordance with various requirements.

SUMMARY OF THE INVENTION

It is therefore a primary objective of the present invention to provide a method of forming shallow trenches in a semiconductor substrate, which allows the thus-formed trenches to be shaped with a rounded top corner having a desired radius of curvature in accordance with actual requirements.

In accordance with the foregoing and other objectives of the present invention, a new method for forming shallow trenches in a semiconductor substrate is provided. This method includes the following steps of:

(1) forming a pad oxide layer and a mask layer successively over the substrate;

(2) removing selected portions of the pad oxide layer and the mask layer so as to expose a selected surface area of the substrate where the trench is to be formed;

(3) removing an exposed portion of the substrate to a predetermined depth so as to form a pre-trench;

(4) performing a thermal oxidation process on the substrate so as to form an oxide layer in the pre-trench in the substrate; and (5) removing the oxide layer, such that the empty space left by the removed oxide layer serves as the trench.

From experiments, it is learned that the radius of curvature of the top corners of the trench decreases linearly with the depth of a pre-trench formed by over-etching in the substrate. The linear relationship between radius of curvature and depth of the pre-trench can be pre-established by experimentation. After that, the radius of curvature of the top corners of the shallow trenches in the substrate can be controlled by adjusting the depth of the pre-trench in the substrate in accordance with the pre-established linear relationship.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENT

Two preferred embodiments of the method according to the invention will be disclosed in the following, respectively with reference to FIGS. 2A–2B and FIGS. 3A–3B. The first preferred embodiment of FIGS. 2A–2B is used to form a shallow trench having rounded top corners shaped with a first desired radius of curvature in a semiconductor substrate; while the second preferred embodiment of FIGS. 3A–3B is used to form a shallow trench having rounded top corners shaped with a second desired radius of curvature.

First Preferred Embodiment

Figure 2A:
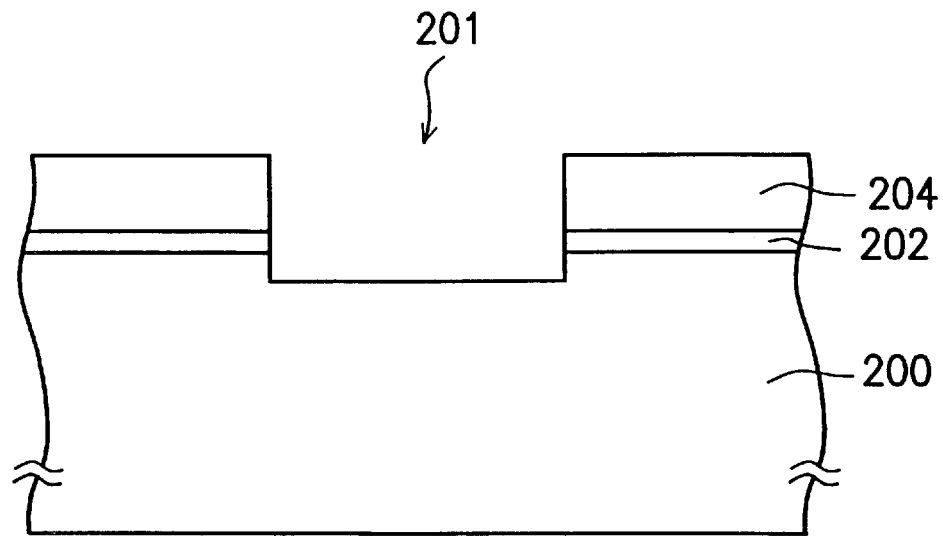
FIGS. 2A and 2B are schematic sectional diagrams used to depict the steps involved in a first preferred embodiment of the method according to the invention for forming a shallow trench having rounded top corners shaped with a first desired radius of curvature in a semiconductor substrate.
Figure 3A:
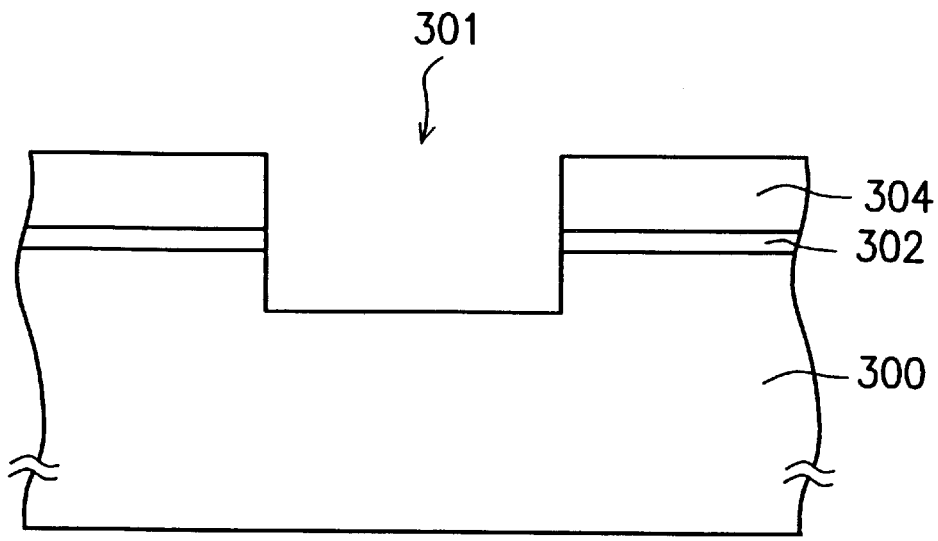
FIGS. 3A and 3B are schematic sectional diagrams used to depict the steps involved in a second preferred embodiment of the method according to the invention for forming a shallow trench having rounded top corners shaped with a second desired radius of curvature in a semiconductor substrate.
Figure 3B:
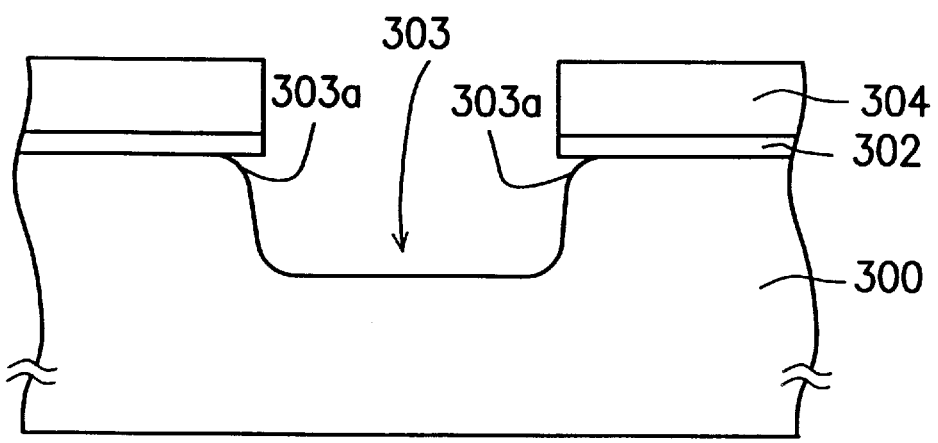

Referring to FIG. 2A, in the first step of the first preferred embodiment of the method of the invention, a semiconductor substrate 200 is prepared. Over the substrate 200, a pad oxide layer 202, such as a layer of silicon dioxide, is formed. Further, a mask layer 204, such as a layer of silicon nitride, is formed over the pad oxide layer 202. A photolithographic and etching process is then performed on the substrate so as to remove selected portions of the mask layer 204 and pad oxide layer 202 to form an opening which exposes a selected surface area of the substrate 200. Through the opening, an etching process is performed on the substrate 200 until the exposed portion of the substrate 200 is etched away to a depth of about 400 Å (angstroms). The removed portion of the substrate 200 thus forms a pre-trench 201 in the substrate 200.

Figure 2B:
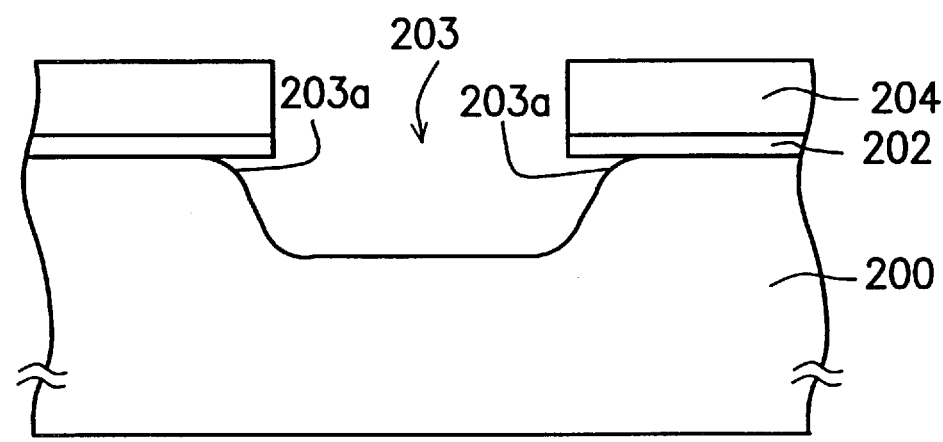
Figure 2C:
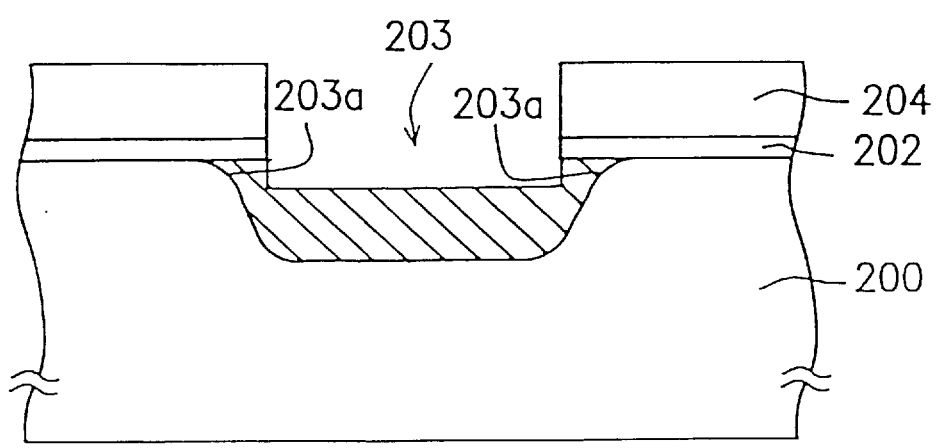
FIG. 2C is a schematic sectional diagram showing a beak-like oxide layer.

Referring next to FIG. 2B, in the subsequent step, a thermal oxidation process is performed on the substrate so as to form a beak-like oxide layer (not shown) on the exposed surface area of the pre-trench 201 in the substrate 200. After this, the beak-like oxide layer (not shown) is removed by etching. The empty space which was previous occupied by the removed oxide layer forms a shallow trench 203 with round top corners 203a.

Figure 1A:
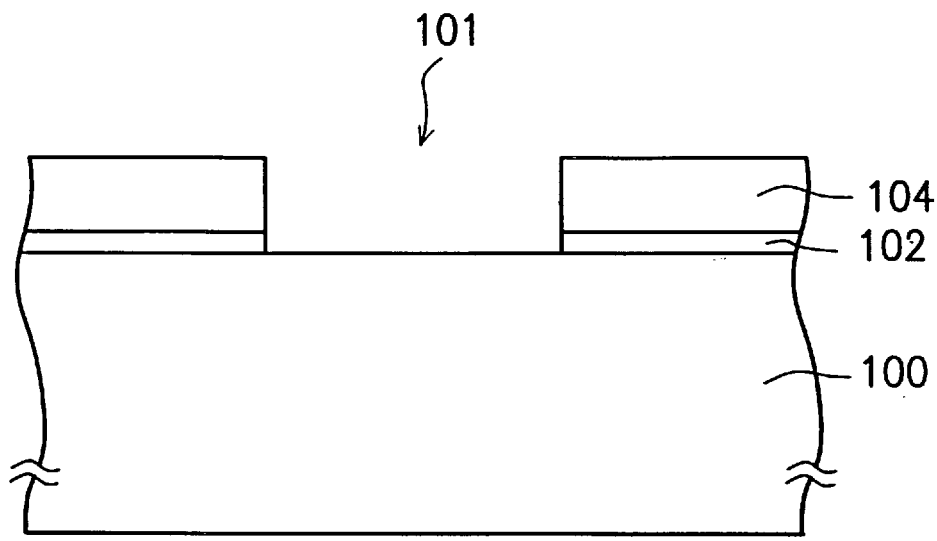
FIGS. 1A and 1B are schematic sectional diagrams used to depict the steps involved in a conventional method for forming a shallow trench with rounded top corners in a semiconductor substrate.
Figure 1B:
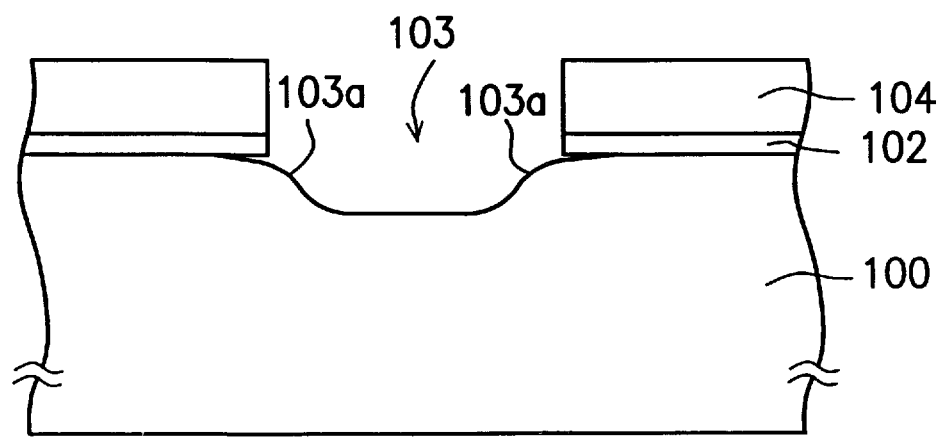

Through measurement, it is found that the radius of curvature of the round top corners 203a of the shallow trench 203 is about 0.0432 μm. Compared to the prior art of FIGS. 1A–1B, this embodiment allows for a smaller radius of curvature.

Second Preferred Embodiment

Referring to FIG. 3A, in the first step of the second preferred embodiment of the method of the invention, a semiconductor substrate 300 is prepared. Over the substrate 300, a pad oxide layer 302, such as a layer of silicon dioxide, is formed. Further, a mask layer 304, such as a layer of silicon nitride, is formed over the pad oxide layer 302. A photolithographic and etching process is then performed on the substrate so as to remove selected portions of the mask layer 304 and pad oxide layer 302 to form an opening which exposes a selected surface area of the substrate 300. Through the opening, an etching process is performed on the substrate 300 until the exposed portion of the substrate 300 is etched away to a depth of about 800 Å (angstroms). The removed portion of the substrate 300 thus forms a pre-trench 301 in the substrate 300.

Referring next to FIG. 3B, in the subsequent step, a thermal oxidation process is performed on the substrate so as to form a beak-like oxide layer (not shown) on the exposed surface area of the pre-trench 301 in the substrate 300. After this, the beak-like oxide layer (not shown) is removed by etching. The empty space which was previous occupied by the removed oxide layer forms a shallow trench 303 with round top corners 303a.

Through measurement, it is found that the radius of curvature of the round top corners 303a of the shallow trench 303 is about 0.0388 μm, which is even smaller than that achieved by the previous embodiment of the method of the invention.

Figure 4:
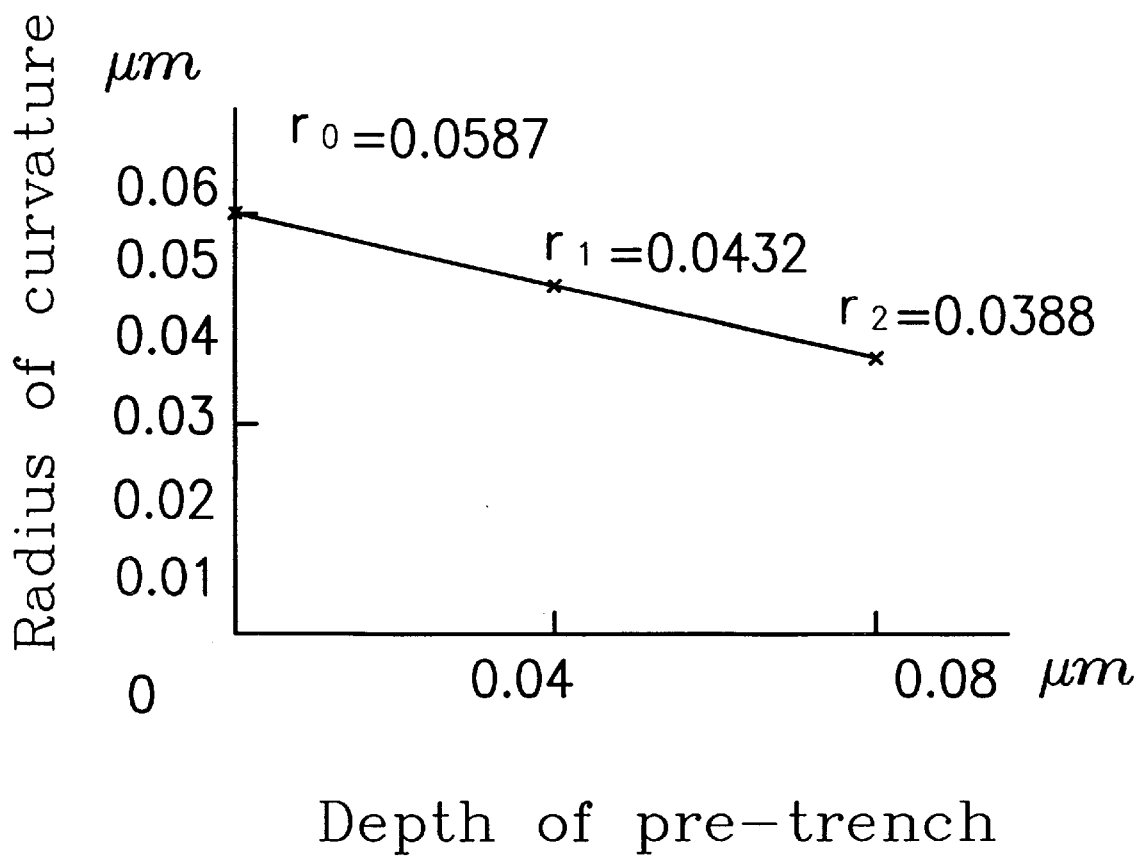
FIG. 4 is a graph showing the relationship between the radius of curvature of the top corners of the thus-formed trench and the depth of the pre-trench.

It can be learned from the foregoing two embodiments of the method of the invention that the radius of curvature of the top corners of the trench is decreased with the depth of the pre-trench in the substrate. Through experiments, the relationship between the radius of curvature and the depth of the pre-trench can be found and plotted in a graph, as for example illustrated in FIG. 4. It can be seen from the graph of FIG. 4 that the relationship between the radius of curvature and depth of the pre-trench is substantially linear. Accordingly, the radius of curvature of the top corners of the shallow trenches in the substrate can be controlled by adjusting the depth of the pre-trench in the substrate.

For a particular substrate, the linear relationship between radius of curvature and depth of the pre-trench can be pre-established by experimentation. After that, the radius of curvature of the top corners of the shallow trenches in that substrate can be controlled by adjusting the depth of the pre-trench in the substrate in accordance with the pre-established linear relationship.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for forming a semiconductor substrate trench having a top corner shaped with a desired radius of curvature, comprising the steps of:

(1) forming a pad oxide layer and a mask layer successively over the substrate;

(2) removing selected portions of the pad oxide layer and the mask layer so as to expose a selected surface area of the substrate where the trench is to be formed;

(3) removing an exposed portion of the substrate to form a pre-trench having a depth to extend below the pad oxide layer;

(4) performing a thermal oxidation process on the substrate to form an oxide layer in the pre-trench in the substrate, the oxide layer extending laterally under the pad oxide layer; and (5) removing the oxide layer, the empty space left by the removed oxide layer serving as the trench having round top corners.

2. The method of claim 1, wherein the pad oxide layer is a layer of silicon dioxide.

3. The method of claim 1, wherein the mask layer is a layer of silicon nitride.

4. The method of claim 1, where in said step (3), the depth of the pre-trench is determined by a relationship between a radius of curvature in the round top corners and the depth of the pre-trench.

5. The method of claim 4, wherein the radius of curvature of the top corner of the trench decreases linearly with the depth of the pre-trench.

6. The method of claim 1, wherein in said step (3), the removal of the exposed portion of the substrate to the depth is performed by a dry etching process.

7. The method of claim 1, wherein in said step (5), the oxide layer is removed by etching.

\* \* \* \* \*